United States Patent
Madar et al.

(10) Patent No.: US 7,655,091 B2
(45) Date of Patent: Feb. 2, 2010

(54) FORMATION OF SINGLE-CRYSTAL SILICON CARBIDE

(75) Inventors: Roland Madar, Eybens (FR); Michel Pons, La Tronche (FR); Francis Baillet, Paladru (FR); Ludovic Charpentier, Grenoble (FR); Etienne Pernot, Sassenage (FR); Didier Chaussende, Chamagnieu (FR); Daniel Turover, Saint Mande (FR)

(73) Assignee: Centre National de la Recherche Scientifique, Paris (FR)

( * ) Notice: Subject to any disclaimer, the term of this patent is extended or adjusted under 35 U.S.C. 154(b) by 457 days.

(21) Appl. No.: 10/514,159

(22) PCT Filed: May 15, 2003

(86) PCT No.: PCT/FR03/01480

§ 371 (c)(1),
(2), (4) Date: Jul. 14, 2005

(87) PCT Pub. No.: WO03/097905

PCT Pub. Date: Nov. 27, 2003

(65) Prior Publication Data

US 2005/0257734 A1    Nov. 24, 2005

(30) Foreign Application Priority Data

May 15, 2002   (FR) .................................. 02 05967

(51) Int. Cl.
*C30B 15/30* (2006.01)
*C23C 16/00* (2006.01)

(52) U.S. Cl. ..................... 117/202; 117/200; 118/715; 118/716; 118/725

(58) Field of Classification Search .................. 117/84, 117/88, 200–224; 118/715–716, 725
See application file for complete search history.

(56) References Cited

U.S. PATENT DOCUMENTS 5,288,326 A * 2/1994 Maeda et al. ................ 118/719

(Continued)

FOREIGN PATENT DOCUMENTS

EP    0554047 A1    8/1993

(Continued)

OTHER PUBLICATIONS

International Search Report dated Nov. 11, 2003 for related PCT Application No. PCT/FR03/01480.

*Primary Examiner*—Robert M Kunemund
*Assistant Examiner*—G. Nagesh Rao
(74) *Attorney, Agent, or Firm*—Howard IP Law Group, PC

(57) ABSTRACT

The invention concerns a device (10) for forming in single-crystal state a compound body with incongruent evaporation, capable of being in monocrystalline or polycrystalline form, comprising at least one first chamber (20) containing a substrate (42) whereat is formed a polycrystalline source of said body and a monocrystalline germ (46) of said body; a second chamber (14), said substrate being arranged between the two chambers; means for input (36) of gaseous precursors of said body into the second chamber capable of bringing about deposition of said body in polycrystalline form on the substrate; and heating means (26) for maintaining the substrate at a temperature higher than the temperature of the germ so as to bring about sublimation of the polycrystalline source and the deposition on the germ of said body in monocrystalline form.

6 Claims, 2 Drawing Sheets

U.S. PATENT DOCUMENTS

Figure 1:
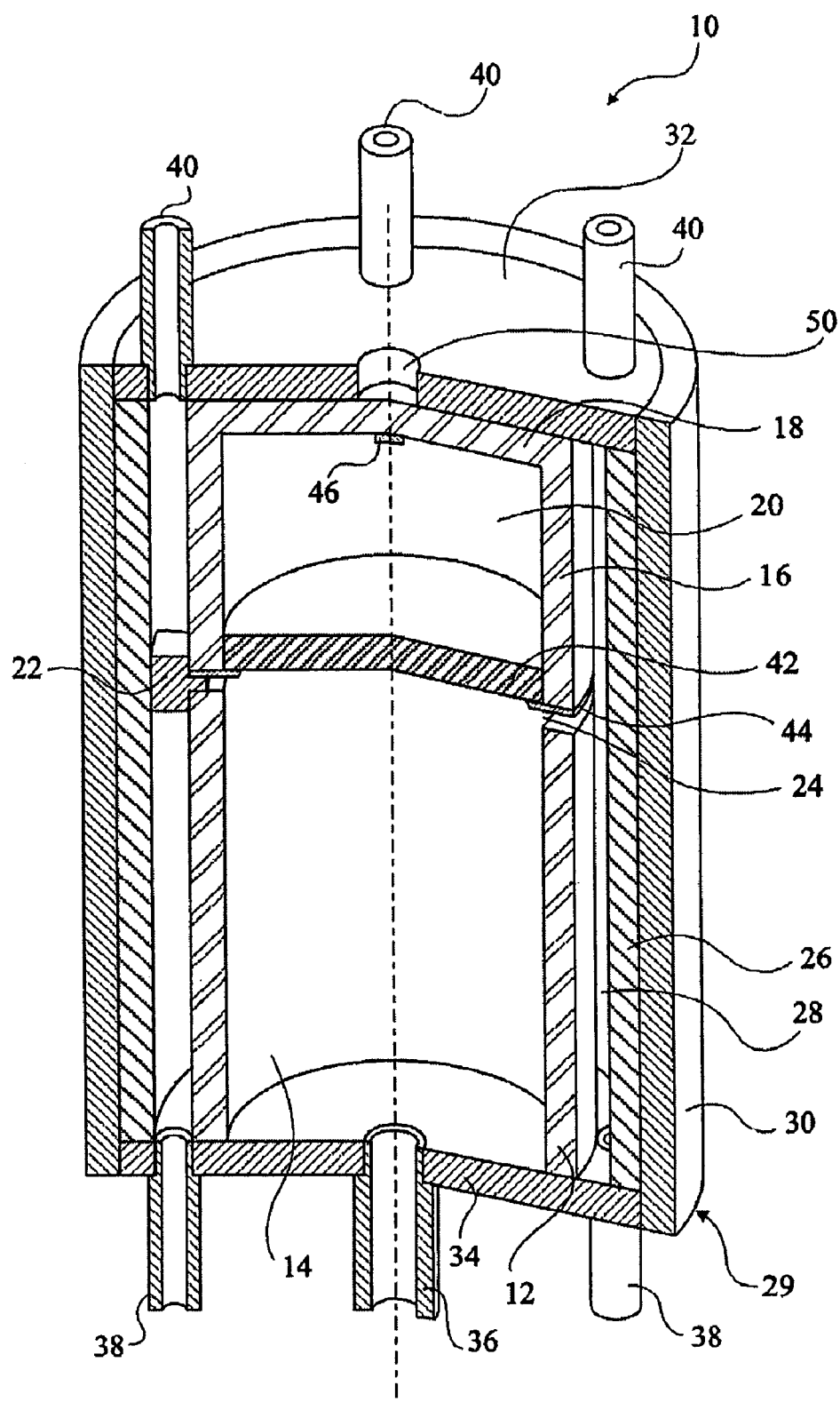

| | | | |
|---|---|---|---|
| 5,704,985 A * | 1/1998 | Kordina et al. | 118/725 |
| 5,945,162 A * | 8/1999 | Senateur et al. | 427/248.1 |
| 5,989,340 A | 11/1999 | Stephani et al. | |
| 6,039,812 A * | 3/2000 | Ellison et al. | 118/725 |
| 6,056,820 A | 5/2000 | Balakrishna et al. | |
| 6,238,739 B1 * | 5/2001 | Madar et al. | 427/255.39 |
| 6,306,211 B1 * | 10/2001 | Takahashi et al. | 117/86 |
| 6,770,137 B2 * | 8/2004 | Hara et al. | 117/201 |
| 6,786,969 B2 * | 9/2004 | Kondo et al. | 117/200 |
| 6,830,618 B2 * | 12/2004 | Hara et al. | 117/200 |
| 7,361,222 B2 * | 4/2008 | Janzen et al. | 117/103 |
| 7,368,297 B2 * | 5/2008 | Pons et al. | 438/1 |
| 2001/0004877 A1 | 6/2001 | Shigeto et al. | |
| 2004/0216661 A1 * | 11/2004 | Kordina | 117/92 |
| 2005/0257734 A1 * | 11/2005 | Madar et al. | 117/89 |
| 2007/0056507 A1 * | 3/2007 | Kordina | 117/89 |

FOREIGN PATENT DOCUMENTS

| | | |
|---|---|---|
| JP | 04265294 | 9/1992 |
| WO | WO 97/13012 | 4/1997 |

* cited by examiner

FORMATION OF SINGLE-CRYSTAL SILICON CARBIDE

CLAIM FOR PRIORITY

This application claims the benefit of French Application No. 02/05967, filed May 15, 2002 and Int'l. Application No. PCT/FR03/01480, filed May 15, 2003 and is incorporated herein by reference.

The present invention relates to a method and a device for forming a single-crystal of a compound that has an incongruent evaporation and that exists in single-crystal or polycrystalline form. The following description will as an example apply to the forming of single-crystal silicon carbide, SiC.

The present invention particularly applies to the forming of ingots or layers of thick single-crystal SiC of a, for example, cubic or hexagonal crystallization type. Such ingots or thick layers may be used for the manufacturing of substrates or active layers usable in microelectronics. For such uses, the single-crystal SiC must exhibit a good crystal quality and a well controlled dopant ratio.

A first known method to manufacture single-crystal SiC ingots of electronic quality is based on the sublimation of an SiC powder and the condensation of the formed vapors on a single-crystal SiC germ. A device for implementing such a method generally comprises a graphite crucible which defines a sublimation enclosure in which are arranged the single-crystal germ from which an SiC ingot is desired to be formed and the SiC powder which forms the SiC source. The SiC powder and the germ are respectively heated up to temperatures $T_1$ and $T_2$ such that $T_1$ is greater than $T_2$.

The previously-described sublimation method exhibits certain disadvantages.

Indeed, despite as meticulous a preparation as possible, the impurities contained in the SiC powder cause defects and unwanted dopings of the obtained single-crystal.

Further, the sublimation method does not enable growth of large single-crystal crystals due to the necessarily limited amount of powder forming the SiC source. Indeed, it is in practice impossible to continuously supply the crucible with SiC powder without excessively disturbing the growth conditions of the single-crystal SiC. Further, it is not possible either to place a large amount of powder in the crucible. Indeed, the SiC sublimation is not congruent and a greater amount of silicon than carbon appears to be generated in the powder sublimation. The powder thus tends to load with carbon. A modification in the composition of the powder and of the vapors resulting from the sublimation is finally obtained as the process develops, which accordingly results in a modification in the growth conditions of the single crystal.

A second method for manufacturing single-crystal SiC ingots consists of a very high temperature chemical vapor deposition (HTCVD) of SiC on a single-crystal SiC germ. In a crucible similar to that described for the sublimation method, gaseous silicon and carbon precursors, for example, silane and propane, are sent, possibly by means of a lifting gas, on the germ and react to form on the germ a single-crystal SiC deposition. The chemical vapor deposition method is also used to form active layers.

The main disadvantage of the chemical vapor deposition method is the extreme difficulty of controlling the single-crystal growth, especially due to the turbulent motions of the gas precursors.

Further, for the forming of active layers, the chemical vapor deposition method does not enable exceeding deposition speeds on the order of two or three tens of micrometers per hour.

The present invention aims at obtaining a method for forming a single-crystal SiC on a single-crystal SiC germ which doe not exhibit the disadvantages of the previously-described methods.

The present invention also aims at obtaining a device for the manufacturing of active layers that can reach a thickness greater than a few tens of micrometers, or of single-crystal SiC ingots.

To achieve these objects, the present invention provides a device for forming in the single-crystal state an incongruent evaporation compound, likely to exist in single-crystal or polycrystalline form, comprising a first enclosure containing a substrate at the level of which is formed a polycrystalline source of said body and a single-crystal germ of said body; a second enclosure, said substrate being arranged between the two enclosures; means for supplying gas precursors of said body into the second enclosure capable of causing the deposition of said body in polycrystalline form on the substrate; and heating means for maintaining the substrate at a temperature greater than the germ temperature to cause the sublimation of the polycrystalline source and the deposition on the germ of said body in single-crystal form.

According to an embodiment of the present invention, said body is silicon carbide.

According to an embodiment of the present invention, the first enclosure is defined by a first cylindrical wall, a cover, on which the germ is attached, at least partly covering one end of the first wall, and the substrate at least partly covering the opposite end of the first wall, said substrate being permeable.

According to an embodiment of the present invention, the second enclosure is defined by a second cylindrical wall arranged in prolongation of the first cylindrical wall on the substrate side. The first and second cylindrical walls are surrounded with a tube which delimits with the first and second cylindrical walls a tubular recess, the second enclosure communicating with said tubular recess.

According to an embodiment of the present invention, the device comprises means for generating a gas flow in the tubular recess to exhaust the gases present in the second enclosure.

According to an embodiment of the present invention, the heating means comprise at least one induction spiral surrounding the tube and conducting an A.C. current to induce induction currents in the tube only.

According to an embodiment of the present invention, the cover is shiftably assembled with respect to the first cylindrical wall along the axis of the first cylindrical wall.

The present invention also provides a method for forming in the single-crystal state an incongruent evaporation compound likely to exist in single-crystal or polycrystalline form, comprising the simultaneously performed steps of forming on a permeable substrate, arranged between first and second enclosures, a source of said body in polycrystalline form by chemical vapor deposition of gas precursors of said body supplying the second enclosure; forming in the first enclosure gaseous bodies by sublimation of a portion of the source; and forming said body in single-crystal form by condensation of the gaseous bodies on a germ arranged in the first enclosure.

According to an embodiment of the present invention, the germ is moved away from the substrate along the forming of the single-crystal silicon carbide.

Figure 2:
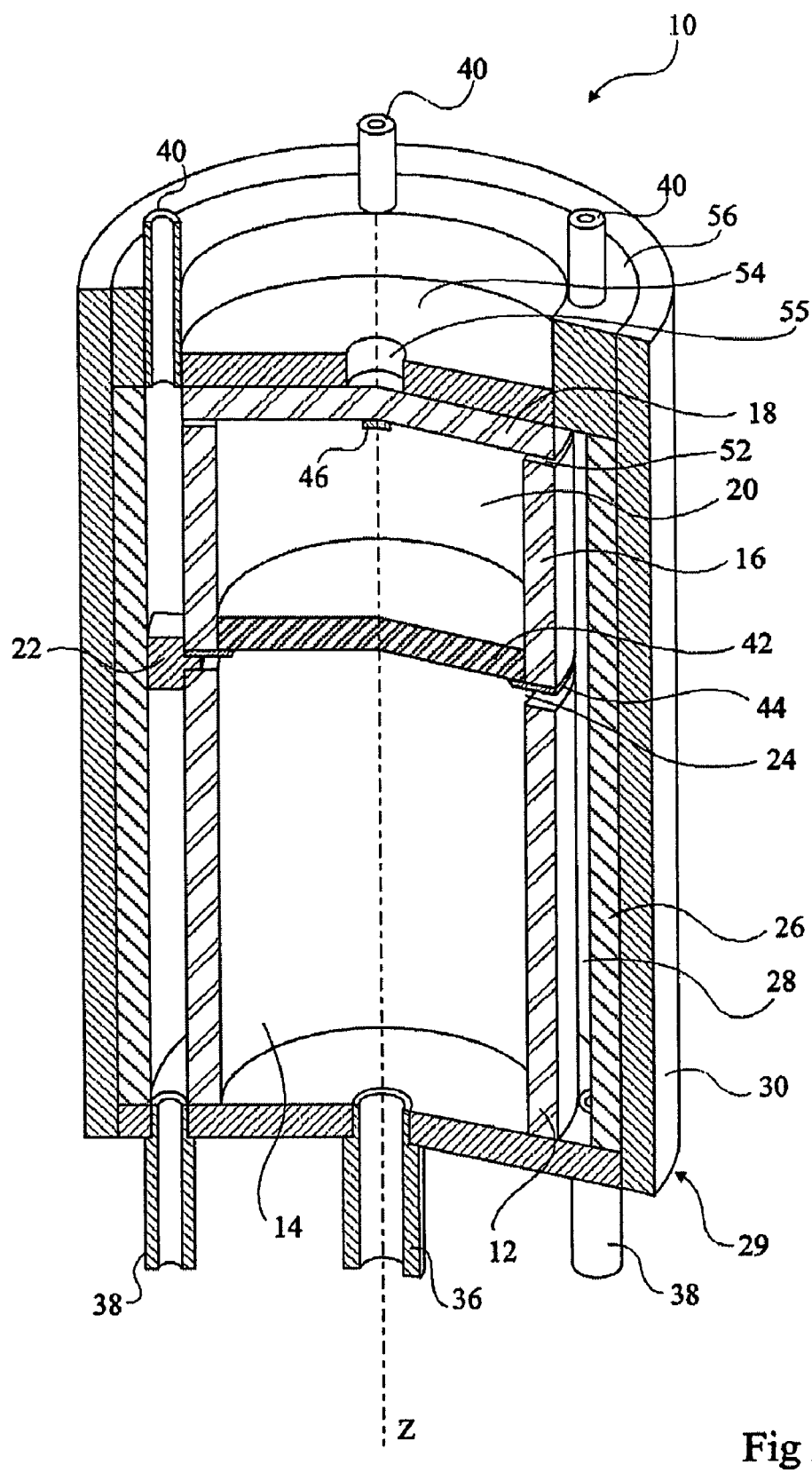

The foregoing and other objects, features, and advantages of the present invention will be discussed in detail in the following non-limiting description of specific embodiments in connection with the accompanying drawings, among which:

FIG. 1 shows a cut-away view of a device for manufacturing single-crystal SiC ingots or thick layers according to the invention; and FIG. 2 shows a cut-away view of a variation of the device of FIG. 1.

FIG. 1 shows a device 10 formed of a first graphite cylindrical wall 12 of axis Z delimiting a first enclosure 14 which will be called the supply enclosure hereafter. A second graphite cylindrical wall 16 of axis Z, for example, of same diameter as first cylindrical wall 12 and closed at one end by a cover 18 solid with cylindrical wall 16, delimits a second enclosure 20, which will be called hereafter the sublimation enclosure. Second cylindrical wall 16 is arranged in prolongation of first cylindrical wall 12 and is separated therefrom by spacers 22, a single spacer being shown in FIG. 1. Spacers 22 delimit a substantially ring-shaped passage 24 between the two enclosures 14, 20. Axis Z corresponds for example to the vertical axis, sublimation enclosure 20 being arranged above supply enclosure 14.

A graphite cylindrical tube 26 of axis Z surrounds the two cylindrical walls 12, 16 and delimits therewith a tubular recess 28.

Both enclosures 14, 20 are enclosed in an isolating package 29 made of graphic felt, formed of a cylindrical wall 30 of axis Z arranged around tube 26 and closed at both ends by substantially circular plates 32, 34.

A gas supply duct 36 communicates with supply enclosure 14 through plate 34. Ducts 38 for supplying a neutral gas communicate with tubular recess 28 through plate 34 on the side of supply enclosure 14. Gas exhaust ducts 40 communicate with tubular recess 28 through plate 32.

A circular substrate 42, for example, made of porous carbon foam or sintered SiC, is laid on a washer 44 maintained against cylindrical wall 16 by spacers 22. The diameter of substrate 42 for example substantially corresponds to the inner diameter of cylindrical wall 16. The diameter of substrate 42 may however be smaller than the inner diameter of cylindrical wall 16, and supply enclosure 14 may partially directly communicate with sublimation enclosure 20. Substrate 42 separates sublimation enclosure 20 from supply enclosure 14. Substrate 42 is permeable to the gases resulting from the sublimation of SiC or at least enables diffusion therethrough of the polycrystalline SiC.

A single-crystal silicon carbide germ 46 is arranged in sublimation enclosure 20 on cover 18. An opening 50 is formed in circular plate 32 and exposes a portion of cover 18 at the level of germ 46.

Induction spirals, not shown, surround cylindrical wall 30 of isolating package 29 substantially at the level of substrate 42. The frequency of the current supplying the induction spirals is such that only tube 26 conducts induced currents. The temperature distribution in enclosures 14, 20 heated by tube 26 then is substantially independent from the materials present in enclosures 14, 20 and accordingly from the chemical phenomena occurring in enclosures 14 and 20.

The SiC manufacturing method according to the present invention is the following.

Device 10 is placed in a chamber under partial vacuum, or in an inert atmosphere to prevent any combustion reaction of the graphite forming the device. A temperature gradient is imposed inside of sublimation enclosure 20 between substrate 42 and germ 46 such that temperature $T_1$ of substrate 42 is greater than temperature $T_2$ of germ 46. Temperature $T_1$ for example ranges between 2000° C. and 2400° C., and temperature $T_2$ for example ranges between 1900° C. and 2200° C. Isolating package 29 limits heat losses opening 50 in isolating package 29 favors the temperature decrease of germ 46.

A flow of a neutral gas, such as argon, is created in tubular recess 28 between supply ducts 38 and exhaust ducts 40. Such a flow tends to carry along the gases present in supply enclosure 14 through passage 24 and to dilute them.

By means of supply duct 36, gas precursors of silicon and of carbon reacting to a high temperature are introduced into supply enclosure 14 and directed towards substrate 42. The gas precursors may be mixed with one or several lifting gases, for example argon and hydrogen. The gas precursors, for example, silane, propane, or gases with a chlorinated base, for example, $SiCl_4$, react at very high temperature to form polycrystalline SiC on substrate 42. The gas precursors, having totally or partially reacted, and the lifting gases are then exhausted from supply enclosure 14 via passage 24 and carried along and diluted in tubular recess 28 by the flowing of neutral gases.

The polycrystalline SiC formed on substrate 42 sublimates to form in sublimation enclosure 20 gaseous species which then condensate on single-crystal germ 46 to grow single-crystal SiC.

The present method enables forming of single-crystal SiC ingots or of thick layers at growth rates greater than 50 μm/hour and that can reach and exceed 1 mm/hour.

FIG. 2 shows a variation of device 10 of FIG. 1 in which cover 18 is mobile along axis Z. A ring-shaped opening 52 then separates cover 18 from cylindrical wall 16.

A circular plate 54 in graphic felt covers cover 18, and comprises an opening 55 formed at the level of germ 46. A graphic felt ring 56 of axis Z closes back tubular recess 28 between cylindrical wall 30 and circular plate 54. Cover 18 and circular plate 54 may be shifted along axis Z by actuators not shown, to be moved away from substrate 42.

Device 10 according to the variation enables forming single-crystal SiC ingots or thick layers with large thicknesses along axis Z. Indeed, by moving cover 18 away from substrate 42 at a speed substantially equal to the growth speed of single-crystal SiC, the distance separating the substrate from the free surface of the formed single-crystal SiC may be maintained approximately constant. The obtained ingots or layers of single-crystal SiC may reach a thickness along axis Z greater than 50 mm. As cover 18 moves, opening 52 tends to widen. The applicant has shown that the gaseous turbulences generated by opening 52 only slightly disturb the growth of the single-crystal SiC.

According to another variation of the present invention, the sublimation enclosure is formed by a main cylindrical wall in which a complementary cylindrical wall may slide. The main cylindrical wall is open at both ends and is separated from the supply enclosure by the substrate. The complementary cylindrical wall is open at one end and closed at one end by a cover supporting the germ. The distance between the germ and the substrate may be adjusted by the sliding of the complementary wall with respect to the main wall. The present variation enables limiting gaseous disturbances in the sublimation enclosure.

The present invention has many advantages.

First, it enables forming single-crystal SiC by a step of sublimation of a polycrystalline SiC source that can be continuously renewed. It thus enables forming ingots or thick layers of large dimensions with high growth rates characteristic of a sublimation forming method.

Second, the forming of the two enclosures, each being dedicated in privileged fashion to a given type of reaction, on the one hand the chemical vapor deposition of polycrystalline SiC and on the other hand the sublimation of the polycrystalline layer, enables continuously renewing the polycrystalline SiC source without disturbing the growth of the single-crystal SiC. Single-crystal SiC of good crystalline quality can thus be obtained.

Third, the present invention enables forming of a polycrystalline silicon carbide source of very high purity since the gas precursors used for the chemical vapor deposition may easily be purified. The obtained single-crystal SiC can thus be of very high purity. The doping of the single-crystal SiC may thus be very precisely controlled by the introduction of dopants into the gas precursors.

Of course, the present invention is likely to have various alterations and modifications which will readily occur to those skilled in the art. In particular, the shape and the dimensions of the furnace should be adapted according to the single-crystal SiC ingots or thick layers to be obtained. Further, the heating device according to the present invention may be used for the forming of single-crystal compounds other than SiC. It may for example be aluminum nitride especially used for optoelectronic applications.

The invention claimed is:

1. A device for forming in the single-crystal state a compound, having an incongruent evaporation and existing in single-crystal or polycrystalline form, comprising:
   a first sublimation enclosure containing a single-crystal germ of said compound;
   a second supply enclosure;
   a substrate arranged between the first sublimation and second supply enclosures and separating the second supply enclosure from the first sublimation enclosure;
   means for supplying gas precursors of said compound into the second supply enclosure, said gas precursors causing the deposition of said compound in polycrystalline form on the substrate in said second supply enclosure; and
   heating means for maintaining the substrate at a temperature greater than the germ temperature to cause the sublimation of the polycrystalline source formed by said gas precursors and the deposition on the germ of said compound in single-crystal form,
wherein the substrate is permeable to the gases originating from the sublimation of the polycrystalline source or allows the diffusion therethrough of the polycrystalline source.

2. The device of claim 1, wherein the first sublimation enclosure is defined by a first cylindrical wall, a cover, on which the germ is attached, at least partly covering one end of the first wall, and the substrate at least partly covering the opposite end of the first wall, said substrate being permeable.

3. The device of claim 2, wherein the second supply enclosure is defined by a second cylindrical wall arranged in prolongation of the first cylindrical wall on the side of the substrate, and the first and second cylindrical walls are surrounded with a tube which delimits with the first and second cylindrical walls a tubular recess, the second supply enclosure communicating with said tubular recess.

4. The device of claim 3, further comprising means for generating a gas flow in the tubular recess to exhaust the gases present in the second supply enclosure..

5. The device of claim 4, wherein the heating means comprise at least one induction spiral surrounding the tube and conducting an A.C. current to induce induction currents in the tube only.

6. The device of claim 2, wherein the cover is shiftably assembled with respect to the first cylindrical wall along the axis (z) of the first cylindrical wall.

\* \* \* \* \*